United States Patent [19]

Yamamoto et al.

[11] Patent Number: 5,095,488

[45] Date of Patent: Mar. 10, 1992

[54] SEMICONDUCTOR LASER

[75] Inventors: Tadashi Yamamoto; Masao Ikeda; Yasue Mikata, all of Kanagawa, Japan

[73] Assignee: Sony Corporation, Tokyo, Japan

[21] Appl. No.: 675,272

[22] Filed: Mar. 26, 1991

[30] Foreign Application Priority Data

Mar. 27, 1990 [JP] Japan .................................. 2-077976

[51] Int. Cl.$^5$ ............................................... H01S 3/19
[52] U.S. Cl. ........................................ 372/45; 372/46
[58] Field of Search .................................. 372/45, 46

[56] References Cited

FOREIGN PATENT DOCUMENTS 0179590 7/1988 Japan ..................................... 372/45

Primary Examiner—Georgia Epps

[57] ABSTRACT

A semiconductor laser formed into a double hetero junction structure comprising an n-type cladding layer and a p-type cladding layer with an active layer interposed therebetween. The p-type cladding layer has a laminated structure consisting of a first cladding layer of $(Al_xGa_{1-x})InP$ disposed on one side adjacent to the active layer and a second cladding layer of $Al_yGa_{1-y}As$ disposed on the reverse side. A deterioration prevention layer of $Al_zGa_{1-y}As$ is included in the first cladding layer at a position spaced apart from the second cladding layer by a predetermined thickness. In addition, the second cladding layer is partially removed, and a current stricture layer is formed at the removed portion. Due to the above design, the semiconductor layer is capable of retaining high reliability with certainty.

9 Claims, 1 Drawing Sheet

SEMICONDUCTOR LASER

BACKGROUND OF THE INVENTION

1. Field of the Invention

The present invention relates to a semiconductor laser and, more particularly, to a visible-ray semiconductor laser composed of AlGaInP.

2. Description of the Prior Art

The visible-ray semiconductor laser composed of AlGaInP has been attracting particular attention of late as a light source for optical information processing, and development of various adequate structures is currently in progress to realize a lower threshold value and lateral mode control for practical use.

Relative to such a semiconductor laser of AlGaInP, there is known an improved example as disclosed in Japanese Patent Laid-open No. She 62 (1987)-26885 filed by the present applicant, wherein a p-type cladding layer on one side to be attached to a header or a heat sink is formed into a dual layer structure (hereinafter referred to as DSC structure) which consists of an AlGaInP layer and an AlGaAs layer of high thermal conductivity so as to enhance the heat radiation effect.

For the purpose of lowering the threshold value in the semiconductor laser, there is provided a ridge pattern wherein both sides of the semiconductor layer adjacent to the p-type cladding layer on the active layer are removed by etching, while a central portion thereof is left unremoved in the shape of a stripe, and an n-type current stricture layer is formed in the removed portion by epitaxial growth.

If the above-described DSC structure is applied to a semiconductor laser of such a ridge pattern, there is achievable an advantage in manufacture of a ridge-shaped region.

More specifically, in a semiconductor laser having the above DSC structure as shown in an exemplary sectional view of FIG. 4, there are sequentially formed an n-type buffer layer 2 of GaAs, an n-type cladding layer 3 of AlGaInP, a non-doped active layer 4, a p-type cladding layer 5 and a cap layer 6 on a semiconductor substrate 1 which is composed of n-type GaAs or the like having a high impurity concentration with its [100] crystal plane used as a main surface. Furthermore, the p-type cladding layer 5 has a laminated structure consisting of a first cladding layer 51 of $(Al_xGa_{1-x})InP$ disposed on one side adjacent to the active layer 4, and a second cladding layer 52 of $Al_yGa_{1-y}As$ disposed on the reverse side.

When the ridge pattern is employed in the semiconductor laser of such a DSC structure, as shown in a schematic sectional view of FIG. 5 representing a process for manufacture of the semiconductor laser, first a striped mask 7 of $SiN_x$ or the like is deposited on a central portion of the cap layer 6, and an etching step is executed from the side of the cap layer 6 by the use of such a mask 7 and an etching liquid of sulfuric acid. As a result of such a step, the etching in progress is apparently brought to a halt at the time when the first cladding layer 51 of AlGaInP, where the corrosive action speed by the etching liquid of sulfuric acid is extremely low, has been exposed to the outside. Therefore, if the etching step is interrupted at such time, merely the cap layer 6 and the second cladding layer 52 of the p-type cladding layer 5 are selectively etched at both sides thereof which are not covered with the mask 7. In this stage, the etching is effected with the liquid entering under the two side edges of the mask 7, and the lateral surface 8 formed by such etching becomes a [111]A crystal surface.

Thereafter, as shown in a schematic sectional view of FIG. 6 (representing a state after completion of a hereafter mentioned current stricture layer 10 and subsequent withdrawal of the mask 7), an n-type current stricture layer 10 of GaAs is selectively formed, while being covered with the mask 7, in the etch-removed portion 9 by epitaxial growth based on a process of MOCVD (Metalorganic Chemical Vapor Deposition). However, due to the existence of As on the lateral surface 8 and the existence of P on the [100] crystal surface of the first cladding layer 51 formed by the etching, it is difficult to attain selective epitaxial growth completely with high reproducibility on both of such surfaces. Furthermore, since heat is applied up to 720° C. or so during such epitaxial growth, P contained in the first cladding layer 51 is evaporated to consequently deteriorate the characteristics thereof, hence raising another problem in the manufacture of a high-reliability element.

OBJECT AND SUMMARY OF THE INVENTION

In view of the problems mentioned, it is an object of the present invention to provide an improved semiconductor laser which retains high reliability and superior reproducibility in a ridge-pattern design with the aforementioned DSC structure.

The semiconductor laser of the present invention is formed into a double hetero junction structure comprising an n-type cladding layer and a p-type cladding layer with an active layer interposed therebetween. The p-type cladding layer has a laminated structure consisting of a first cladding layer of $(Al_xGa_{1-x})InP$ disposed on one side adjacent to the active layer and a second cladding layer of $Al_yGa_{1-y}As$ disposed on the reverse side. Furthermore a deterioration prevention layer of $Al_zGa_{1-z}As$ is included in the first cladding layer at a position spaced apart from the second cladding layer by a predetermined thickness. In addition, the second cladding layer is partially removed, and a current stricture layer is formed in the removed portion. Due to the above novel design, an improved semiconductor laser of high reliability is attainable with certainty.

In the compositions of the individual layers, x, y, z represent atomic rates which are defined as $0.5 \leq x \leq 1$, $0.6 \leq y \leq 1$, and $0.6 \leq z \leq 1$, respectively.

In such a design of the present invention adopting a DSC structure, the second cladding layer of AlGaAs having a high thermal conductivity is included in the p-type cladding layer, so that a satisfactory heat radiation effect is attainable by attaching the semiconductor laser to a header or a heat sink at the p-type cladding layer side thereof. And during the selective etching executed to form the current stricture layer, the first cladding layer of AlGaInP is capable of serving as a stopper against the selective etching, whereby the etching up to a predetermined position can be controlled with certainty.

Further in the first cladding layer, there is included the deterioration prevention layer of $Al_zGa_{1-z}As$ which has the effect of blocking P. Consequently such a deterioration prevention layer is capable of checking evaporation of P from the principal first cladding layer of the first cladding layer on one side adjacent to the active layer, thereby averting both reduction of the cladding layer characteristics and deterioration of the crystallinity.

In the design of the present invention, the surface of the first cladding layer containing P as a stopper against the etching is formed opposite to the removed portion etched for forming the current stricture layer, and such a surface is composed of a sufficiently thin layer due to the existence of the deterioration prevention layer, so that P contained in the thin-film layer is mostly evaporated or turned into AsP by the heat applied during the epitaxial growth in forming the current stricture layer. Consequently, it becomes possible to avert the disadvantage that satisfactory epitaxial growth is impeded as mentioned by the residual phosphorus formerly existing in the removed portion.

Therefore, according to the design of the present invention, a high-reliability semiconductor laser retaining a low threshold value can be realized with superior reproducibility.

The above and other features and advantages of the present invention will become apparent from the following description which will be given with reference to the illustrative accompanying drawings.

DESCRIPTION OF THE PREFERRED EMBODIMENT

Hereinafter a preferred embodiment of the present invention will be described with reference to FIG. 1. For the purpose of making the invention best understood with facility, a description will be given also of an exemplary manufacturing process thereof with reference to FIGS. 2 and 3.

Figure 2:
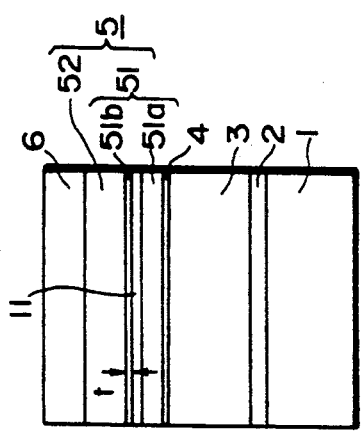
FIGS. 2 and 3 illustrate steps in the process of manufacturing such a semiconductor laser.

First, as illustrated in a schematic sectional view of FIG. 2, a plurality of layers are sequentially formed on a semiconductor substrate 1, which is composed of n-type GaAs or the like of a high impurity concentration and has a main surface formed of a [100] crystal plane, with epitaxial growth effected by the continuous MOCVD process. Such a plurality of layers includes a buffer layer 2 composed of n-type GaAs and having a thickness of 0.3 $\mu$m or so; a cladding layer 3 composed of n-type AlGaInP and having a thickness of 1.5 $\mu$m or so; an active layer 4 composed of non-doped GaInP and having a thickness of 700 Å or so; a p-type cladding layer 5; and a cap layer 6 having a thickness of 0.8 $\mu$m or so. In particular, the p-type cladding layer 5 has a laminated structure consisting of a first cladding layer 51 of $(Al_xGa_{1-x})InP$ disposed on one side adjacent to the active layer 4 and having a thickness of 0.3 $\mu$m or so, and a second cladding layer 52 of $Al_yGa_{1-y}As$ disposed on the reverse side and having a thickness of 0.8 $\mu$m or so. In addition thereto, a deterioration prevention layer 11 of $Al_zGa_{1-z}As$ is included in the first cladding layer 51 at a position spaced apart by a predetermined small thickness t from the second cladding layer 52. More specifically, the first cladding layer 51 consists of a principal first cladding layer 51a adjacent to the active layer 4, the deterioration prevention layer 11, and a thin-film first cladding layer 51b of a thickness t superimposed sequentially.

The n-type cladding layer 3 is composed of n-type $(Al_xGa_{1-x})InP$ (where $0.5 \leq x \leq 1$) such as $(Al_{0.5}Ga_{0.5})_{0.5}In_{0.5}P$ for example; the active layer 4 is composed of non-doped $Ga_{0.5}In_{0.5}P$ for example; the principal first cladding layer 51a and the thin-film first cladding layer 51b of the first cladding layer 51 in the p-type cladding layer 5 are both composed of p-type $(Al_xGa_{1-x})InP$ (where $0.5 \leq x \leq 1$) such as $(Al_{0.5}Ga_{0.5})_{0.5}In_{0.5}P$ for example; and the deterioration prevention layer 11 and the second cladding layer 52 are composed of p-type $Al_zGa_{1-z}As$ and p-type $Al_yGa_{1-y}As$ respectively (where $0.6 \leq z \leq 1$, $0.6 \leq y \leq 1$) such as $Al_{0.6}Ga_{0.4}As$, for example.

In forming each layer by the MOCVD process, $H_2Se$ may be used as an n-type impurity source, and DMZn as a p-type impurity source.

The thickness of the deterioration prevention layer 11 is selectively set in a range of 50 Å to 1000Å. Such selective setting is based on any thickness less than 50 Å not being effective for completely preventing evaporation of P from the principal first cladding layer 51a, and any thickness exceeding 1000 Å impairing the essential confinement function to the active layer 4.

Meanwhile the thickness t of the thin-film first cladding layer 51b in the first cladding layer 51 is selectively set in a range of 30 Å to 100Å. Such a selective setting, is based on any thickness less than 30 Å being insufficient for exerting the function as an etching stopper, and any thickness exceeding 100 Å causing residual phosphorus P on the surface of the current stricture layer 10 during its epitaxial growth and therefore impairing satisfactory epitaxial growth of the current stricture layer 10.

Figure 3:
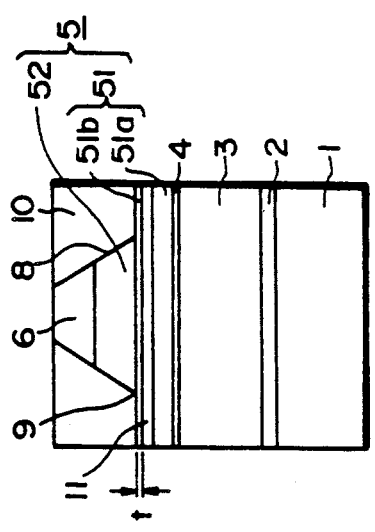
Figure 4:
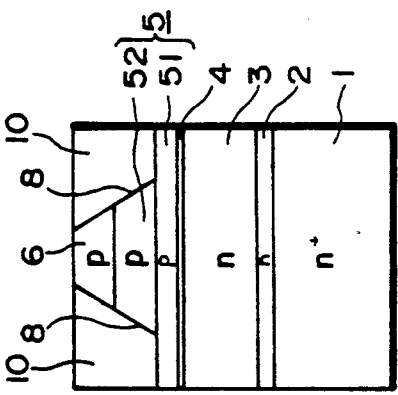
FIGS. 4 through 6 illustrate steps in the process of manufacturing a conventional semiconductor laser.
Figure 5:
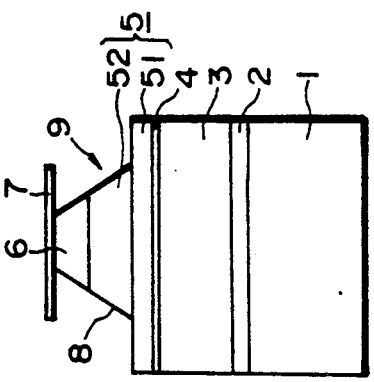
Figure 6:
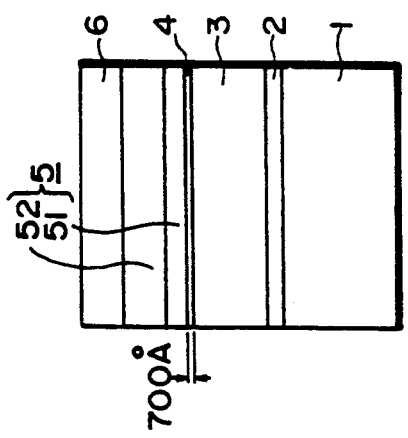

Subsequently, as illustrated in a schematic sectional view of FIG. 3, a striped mask 7 of $SiN_x$ or the like is deposited on a central portion of the cap layer 6, and an etching step is executed from the side of the cap layer 6 by the use of such a mask 7 and an etching liquid of sulfuric acid. Then the etching in progress is apparently brought to a halt at the time when the first cladding layer 51 of AlGaInP, where the corrosive action speed of the etching liquid of sulfuric acid is extremely low, has been exposed to the outside. Therefore, if the etching is interrupted at such a time, merely the cap layer 6 and the second cladding layer 52 of the p-type cladding layer 5 are selectively etched at both sides thereof which are not covered with the mask 7. In this stage, the etching is effected with the liquid entering under the two side edges of the mask 7, and the lateral surface 8 formed by such etching becomes a [111] A crystal surface.

Figure 1:
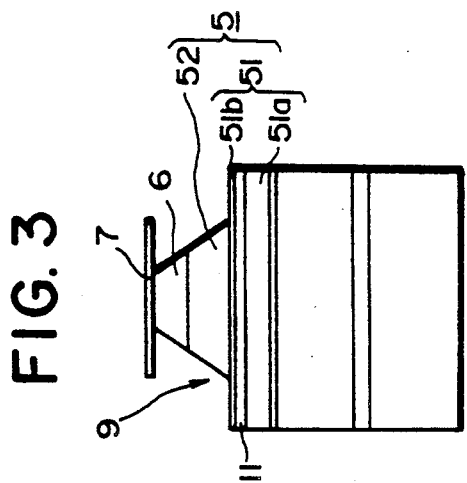
FIG. 1 is a schematic sectional view of an exemplary semiconductor laser embodying the present invention.

Thereafter, as shown in a schematic sectional view of FIG. 1, a current stricture layer 10 of n-type GaAs is formed, while being covered with the mask 7, in the etch-removed portion 9 by selective epitaxial growth based on the MOCVD process. FIG. 1 illustrates a state after withdrawal of the mask 7.

In the embodiment mentioned, Se is used as an n-type impurity and Zn as a p-type impurity, respectively. However, it is to be understood that the impurities are not limited to such examples alone and may be Si, Mg and so forth as well. Thus, a variety of changes and modifications may be provided without being restricted to the above embodiment.

According to the above-described design of the present invention where a DSC structure is provided, the second cladding layer 52 of AlGaAs having a high thermal conductivity is included in the p-type cladding layer 5, so that a satisfactory heat radiation effect is attainable by attaching the semiconductor laser to a header or a heat sink at the p-type cladding layer side thereof. Furthermore, during the selective etching executed to form the current stricture layer 10, the first cladding layer 51b of $(Al_xGa_{1-x})$ InP (where $0.5 \leq x \leq 1$) is capable of retaining the function as a stopper against the selective etching, whereby the etching up to a predetermined position can be controlled with certainty.

In addition, the deterioration prevention layer 11 of $Al_zGa_{1-z}As$ is included in the first cladding layer 51, and such material $Al_zGa_{1-z}As$ is effective for blocking P, thereby checking evaporation of the phosphorus P from the principal first cladding layer 51a of the first cladding layer 51 on one side adjacent to the active layer 4. Consequently it becomes possible to avert deterioration of the cladding layer crystallinity.

In the design of the present invention, the surface of the first cladding layer 51 containing P as a stopper against the etching is formed opposite to the removed portion 9 etched for forming the current stricture layer 10, and such a surface is composed of a sufficiently thin layer 51b having a thickness t, so that P contained in such a thin-film layer is mostly evaporated or turned into Asp by the heat applied before and during the epitaxial growth in forming the current stricture layer 10, hence averting the aforementioned disadvantage that adequate epitaxial growth is impeded by the residual phosphorus P existent formerly in the removed portion 9.

Consequently, it is rendered possible by the present invention to realize a high-reliability semiconductor laser with superior reproducibility.

Although various minor changes and modifications might be proposed by those skilled in the art, it will be understood that we wish to include within the claims of the patent warranted hereon all such changes and modifications as reasonably come within our contribution to the art.

What is claimed is:

1. In a semiconductor laser formed into a double hetero junction structure:
    an n-type cladding layer and a p-type cladding layer with an active layer interposed therebetween;
    said p-type cladding layer having a laminated structure comprised of a first cladding layer of $(Al_xGa_{1-x})$InP disposed on one side adjacent to said active layer and a second cladding layer of $Al_yGa_{1-y}As$ disposed at an opposite side of said p-type cladding layer;
    a deterioration prevention layer of $Al_zGa_{1-z}As$ being located in said first cladding layer at a position spaced apart from said second cladding layer by a predetermined thickness and also spaced from said active layer; and
    said second cladding layer being partially removed, and a current stricture layer being formed at said removed portion.

2. In the semiconductor laser according to claim 1 wherein said x, y, z representing atomic rates in the compositions are defined as $0.5 \leq x \leq 1$, $0.6 \leq y \leq 1$, and $0.6 \leq z \leq 1$, respectively.

3. In the semiconductor laser according to claim 1 wherein a thin-film cladding layer is included in said first cladding layer, and a thickness of said thin-film layer is selectively set in a range of 30 Å to 100 Å.

4. In the semiconductor laser according to claim 1 wherein a thickness of said deterioration prevention layer is selectively set in a range of 50 Å to 100 Å.

5. In the semiconductor laser according to claim 1 said p-type cladding layer beginning from said active layer having a layer sequence of said first cladding layer, said deterioration prevention layer, a thin-film portion of said first cladding layer, and said second cladding layer, said thin-film portion of said first cladding layer being said predetermined thickness by which said deterioration prevention layer is spaced apart from said second cladding layer.

6. In a semiconductor laser formed into a double hetero junction structure:
    an n-type cladding layer and a p-type cladding layer with an active layer interposed therebetween;
    said p-type cladding layer having a laminated structure comprising a first cladding layer having a first cladding layer portion adjacent said active region, a second thin-film cladding layer portion, and a deterioration prevention layer between the first and second cladding layer portions, and a second cladding layer adjacent the second thin-film cladding layer portion;
    said second cladding layer being partially removed and a current stricture layer being formed at said removed portion; and
    said deterioration prevention layer comprising means for blocking evaporation of P from the first cladding layer during epitaxial growth of said current stricture layer.

7. In the semiconductor laser according to claim 6 said first cladding layer comprising means for serving as a stopper against selective etching when said second cladding layer is partially removed.

8. In a semiconductor laser according to claim 6 said first cladding layer first portion comprising $(Al_xGa_{1-x})$InP and said deterioration prevention layer comprising $Al_zGa_{1-z}As$.

9. In a semiconductor laser formed into a double hetero junction structure:
    an n-type cladding layer and a p-type cladding layer with an active layer interposed therebetween;
    said p-type cladding layer having a laminated structure comprising a first cladding layer having a first cladding layer portion adjacent said active region, a second thin-film cladding layer portion, and a deterioration prevention layer between the first and second cladding layer portions, and a second cladding layer adjacent the second thin-film first cladding layer portion;
    said second cladding layer being partially removed and a current stricture layer being formed at said removed portion; and
    said deterioration prevention layer comprising means for preventing deterioration of the first cladding layer during formation of said current stricture layer.

* * * * *